United States Patent
Wang et al.

(10) Patent No.: US 7,022,551 B2
(45) Date of Patent: Apr. 4, 2006

(54) QUAD FLAT FLIP CHIP PACKAGING PROCESS AND LEADFRAME THEREFOR

(75) Inventors: Hsueh-Te Wang, Kaohsiung (TW); Meng-Jen Wang, Pingtung (TW); Chien Liu, Kaohsiung (TW); Chi-Hao Chiu, Pingdung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/967,910

(22) Filed: Oct. 18, 2004

(65) Prior Publication Data
US 2005/0101053 A1    May 12, 2005

(30) Foreign Application Priority Data
Oct. 16, 2003    (TW) .............................. 92128658 A

(51) Int. Cl.
*H01L 21/44*    (2006.01)

(52) U.S. Cl. ........................ 438/108; 438/106; 257/778
(58) Field of Classification Search ................ 257/777, 257/778; 438/106, 108
See application file for complete search history.

(56) References Cited

U.S. PATENT DOCUMENTS

2004/0046264 A1 *   3/2004   Ho et al. ..................... 257/778
2005/0156296 A1 *   7/2005   Wang et al. ................. 257/673

* cited by examiner

Primary Examiner—Thao P. Le
(74) Attorney, Agent, or Firm—J.C. Patents

(57) ABSTRACT

A quad flat flip chip packaging process and a leadframe therefor are provided. A sacrificial film is attached on the leads of the leadframe for limiting the extent of bumps when formed and saving the manufacturing cost. Besides, the sacrificial film can be removed from the leadframe after a reflow step. Thus, the delamination between the molding compound material and the leads can be prevented during the molding step.

12 Claims, 4 Drawing Sheets

QUAD FLAT FLIP CHIP PACKAGING PROCESS AND LEADFRAME THEREFOR

CROSS-REFERENCE TO RELATED APPLICATION

This application claims the priority benefit of Taiwan application serial no. 92128658, filed on Oct. 16, 2003.

BACKGROUND OF THE INVENTION

1. Field of the Invention

The present invention relates to a quad flat flip packaging process and a leadframe therefor. More particularly, the present invention relates to a quad flat flip packaging process and a leadframe therefor directed to lowering the manufacturing cost and preventing the delamination between the molding compound material and the leads.

2. Description of the Related Art

Semiconductor Industry is one of the most developed hi-technology in recent years. With the technology advancing, the hi-tech electronics industries have developed thinner, lighter and more compact products with artificial intelligence and better functions. In the manufacturing process of semiconductor products, a leadframe is one of the most popular elements in package. A quad flat package (QFP) is divided into I-type (QFI), J-type (QFJ) and non-lead-type (QFN), according to the shape of the lead of leadframes. It is noted that a QFP has relatively shorter signal traces and a relatively higher speed for signal transferring, and thus becomes mainstream in the package field with low pin count, and is suitable for chip package with high-frequency (i.e. radio frequency) transferring.

FIG. 1 is a side view of a conventional quad flat non-lead flip chip package. FIG. 2 is a bottom view of a conventional quad flat non-lead flip chip package of FIG. 1.

Please refer to FIGS. 1 and 2. The conventional quad flat non-lead flip chip package 100 comprises a chip 110, leads 120 and a molding compound material 130. The chip 110 has an active surface 112 and a corresponding backside surface 114. The active surface 112 refers to a surface having active elements. Further, bonding pads 116 are located on the active surface 112 of the chip 110. The bonding pads 116 are usually exposed through openings of a passivation layer (not shown).

Each of the leads 120 has an upper surface 122 and a lower surface 124. The bonding pads 116 of the chip 110 are respectively connected with the upper surface 122 of the leads 120 through bumps 140, such that the bonding pads 116 are electrically connected with the leads 120. The molding compound material 130 encapsulates the chip 110, bumps 140 and leads 120 and exposes the lower surface 124 of each of the leads 120, as shown in FIG. 2. In other words, after finishing the encapsulating of the molding compound material 130, the lower surface 124 of each of the leads 120 is exposed for connecting with other carriers or elements.

In the conventional manufacturing process of a quad flat non-lead package, a solder mask layer 150 is usually formed on the upper surface 122 of the leads 120. The solder mask layer 150 has openings 152 for exposing partial region of the upper surface 122 of the leads 120. The exposed region is used as a bump connection region for the bumps 140 and leads 120. It is noted that the openings 152 of the solder mask layer 150 is used to limit the extent of the bumps 140 when formed. Since the solder mask layer 150 has the non-stick property against solder, it limits the solder range within the openings 152 when the bumps 140 are welded on the upper surface 122 of the leads 120. Therefore, the solder mask layer is able to control the height of bump collapse. However, the conventional solder mask layer 150 needs a photo-masking process to define positions of openings 152, which increases the manufacturing difficulty and manufacturing cost. Besides, after the molding process, delamination between the molding compound material 130 and the solder mask layer 150 and between the solder mask layer 150 and leads 120 will reduce the reliability of package.

SUMMARY OF THE INVENTION

According to one aspect of the present invention, it is to provide a quad flat flip chip packaging process, wherein a sacrificial film is directly formed on the leads of the leadframe to replace the conventional solder mask layer. The sacrificial film is used to control the height of bump collapse, and is removed after the leadframe is electrically connected with the chip through the bumps. Thus, the delamination due to the sacrificial film can be prevented and the reliability of package can be improved.

According to another aspect of the present invention, it is to provide a quad flat flip chip packaging process, wherein a sacrificial film with non-stick property against solder is attached on the leads of the leadframe to replace the conventional solder mask layer. Therefore, the process of photo-masking for patterning the solder mask layer can be spared.

According to still another aspect of the present invention, it is to provide a leadframe, wherein a sacrificial film with non-stick property against solder is attached on the leads of the leadframe to replace the conventional solder mask layer. The sacrificial film is able to control the height of bump collapse when connecting the leadframe and the chip through bumps, and thus the manufacturing cost can be reduced.

According to yet another aspect of the present invention, it is to provide a leadframe, wherein the sacrificial film can be removed from the leadframe after the leadframe is connected with the chip through bumps. When the leadframe is molded after the sacrificial film has been removed, the delamination between the molding compound material and the leads can be prevented.

Accordingly, the present invention provides a quad flat flip chip packaging process comprising the steps of: providing a leadframe having at least a plurality of leads with an upper surface and a lower surface, wherein one end of each of the leads includes a bump connection region located on the upper surface; attaching a sacrificial film next to the bump connection region; providing a chip to be electrically connected with the bump connection region of the leads through a plurality of bumps; removing the sacrificial film; and using a molding compound material to encapsulate the chip and the leads and to expose the lower surface of the leads.

Accordingly, the present invention provides a leadframe for a quad flat package, wherein the leadframe comprises a plurality of leads and a sacrificial film. One end of each of the leads has a bump connection region. The detachable sacrificial film is located next to the bump connection region of the leads.

In one embodiment of the present invention, the sacrificial film has non-stick property against solder.

In one embodiment of the present invention, the bonding pads on the active surface of the chip are electrically connected with the bump connection regions of the leads through the bumps by using a reflowing step.

In one embodiment of the present invention, a singulation step follows a molding step. In one example, the singulation step is to trim the molded leadframe with chips into packages.

In one embodiment of the present invention, the sacrificial film is a patterned film with an opening for exposing the bump connection regions of the leads. Furthermore, the patterned film can have a plurality of openings with the same number with the pin-count, wherein the openings respectively expose the bump connection regions of the leads.

In one embodiment of the present invention, the leadframe further comprises a frame. The other end of each of the leads is connected with the inner edge of the frame. Besides, the leadframe further comprises a heat-dissipating plate and at least a tie bar for connecting the heat-dissipating plate to the frame, wherein the leads are disposed around the edges of the heat-dissipating plate. Thus, the heat generated by the chip can be led out through the heat-dissipating plate.

Because the present invention provides a sacrificial film with non-stick property against solder on one end of the lead of the leadframe to replace the conventional solder mask layer which is harder and more costly to manufacture, the present invention can thus simplify the manufacturing process and reduce the manufacturing cost. Furthermore, since the sacrificial film can be removed after the reflow step, the delamination between the molding compound material and the leads can be prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The following drawings illustrate embodiments of the invention and, together with the description, serve to explain the principles of the invention.

DESCRIPTION OF THE EMBODIMENTS

FIGS. 3 through 6 are schematic views showing a process flow of a quad flat non-lead packaging according to one embodiment of the present invention.

Figure 1:
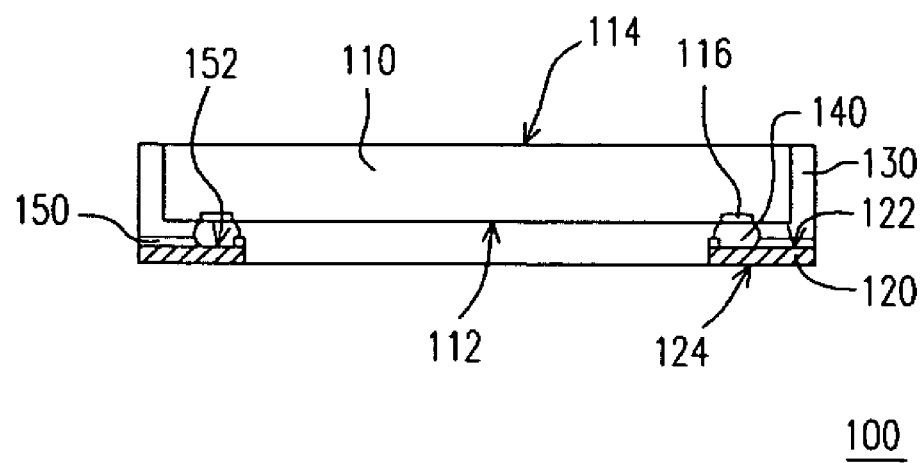
FIG. 1 is a side view of a conventional quad flat non-lead package.
Figure 2:
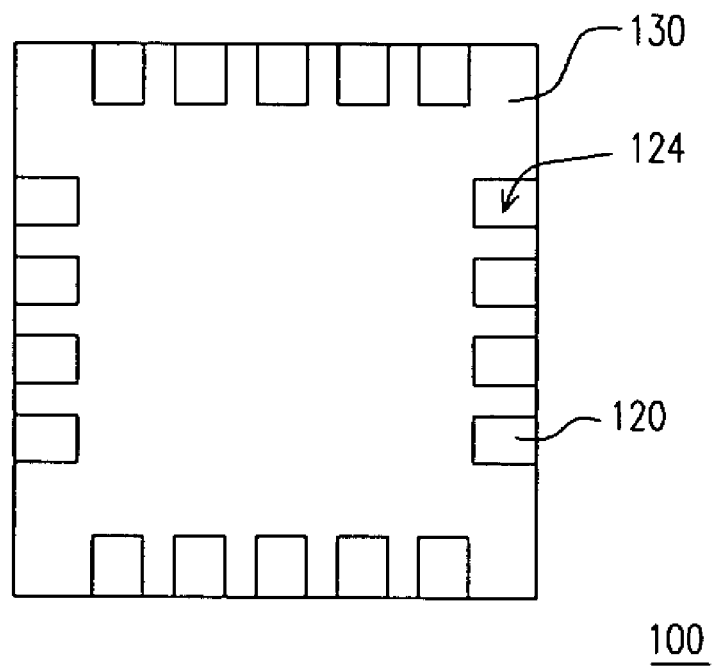
FIG. 2 is a bottom view of a conventional quad flat non-lead package of FIG. 1.
Figure 3:
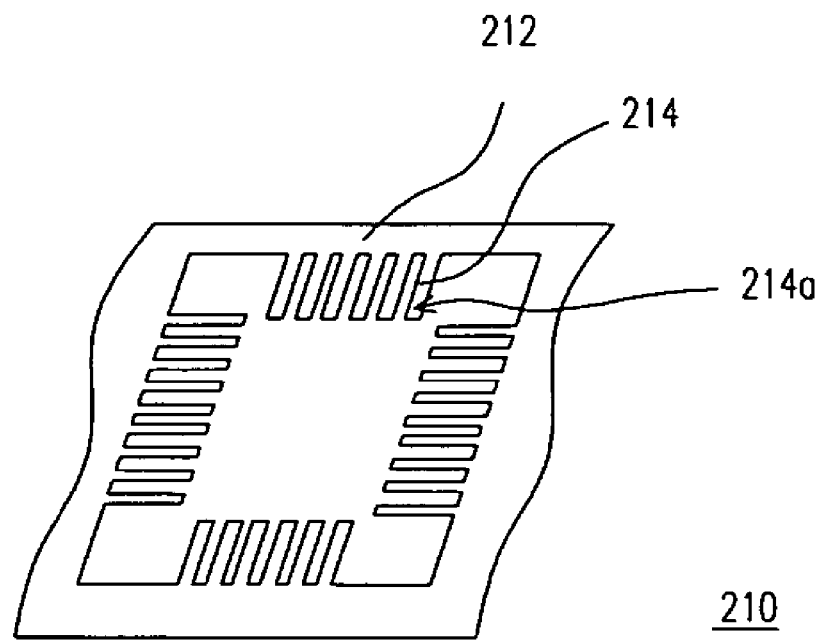
FIGS. 3 through 6 are schematic views showing a process flow of a quad flat non-lead packaging according to one embodiment of the present invention.

With reference to FIG. 3, the quad flat flip chip packaging process of the present invention comprises the following steps. First, a leadframe 210 with a frame 212 and a plurality of leads 214 is provided. Each of the leads 214 has an upper surface and a lower surface. One end of each of the leads 214 includes a bump connection region 214a on the upper surface. The other end of each of the leads 214 is connected with the inner edge of the frame 212.

Figure 4:
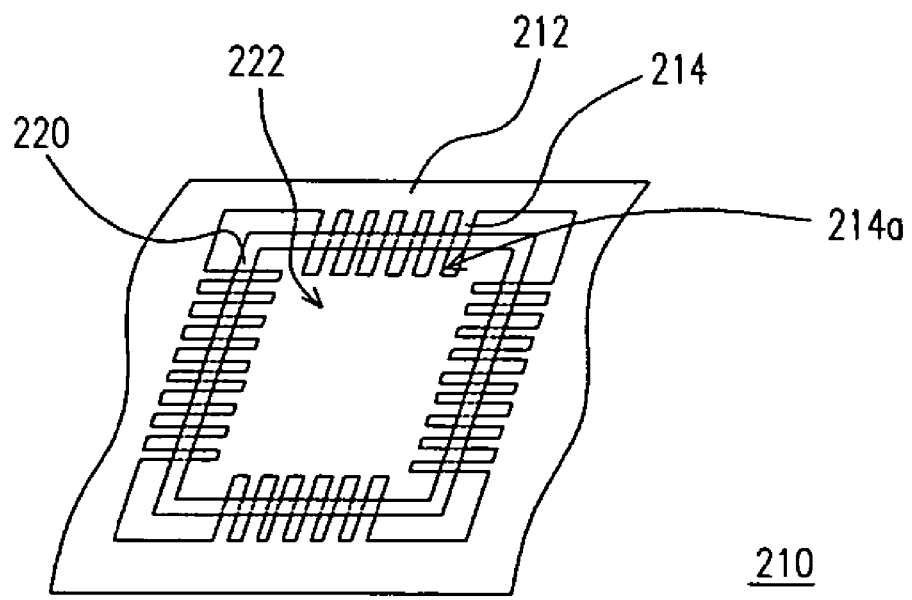

With reference to FIG. 4, a sacrificial film 220 is formed next to the bump connection region 214a. Preferably, the sacrificial film 220 has non-stick property against solder. For example, the sacrificial film 220 can be a patterned film with an opening 222. When the sacrificial film 220 is attached next to the bump connection region 214a of the leads 214, the opening 222 of the sacrificial film 220 exposes the bump connection region 214a of the leads 214.

Figure 5:
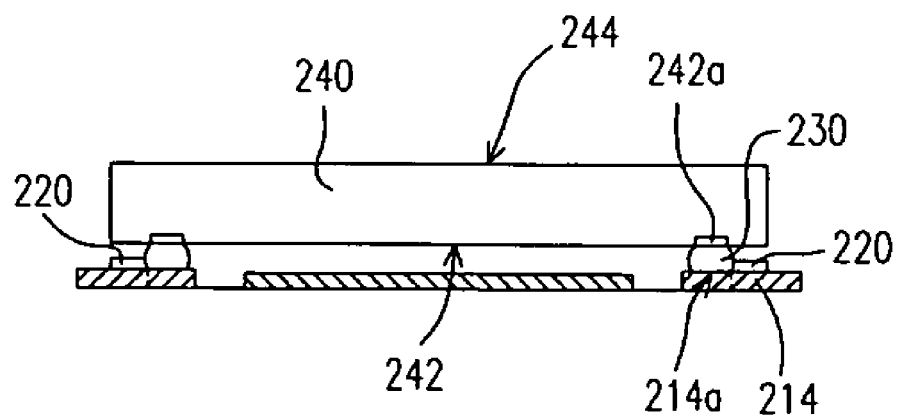

With reference to FIG. 5, a chip 240 with an active surface 242 and a corresponding backside surface 244 is provided. The active surface 242 refers to the surface having active elements. A plurality of bonding pads 242a are disposed on the active surface 242. A reflow step is performed to make the bonding pads 242a of the chip 240 electrically connect with the bump connection region 214a of the leads 214 through the bumps 230. In an ideal situation, it is noted that the sacrificial film 220 does not deform during reflow step.

The sacrificial film 220 with non-stick property against solder is disposed on the leads 214 and exposes the bump connection region 214a through the opening 222. Thus, the sacrificial film 220 limits the extent of the bumps 230 when formed. Since the sacrificial film 220 has non-stick property against solder, the solder will not be applied out of the extent limited by the opening 222 of the sacrificial film 220. The height of bump collapse can therefore be controlled.

Figure 6:
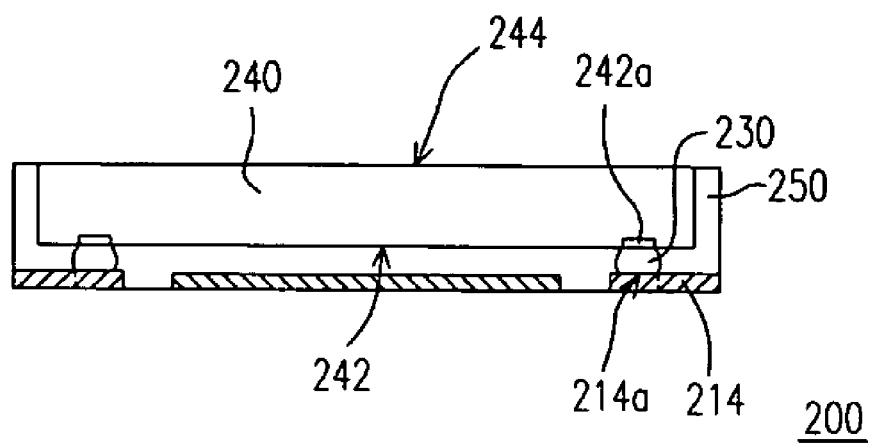

With reference to FIG. 6, the sacrificial film with non-stick property against solder is removed after the reflow step. After that, a molding step is performed by providing a mold (not shown) with a cavity to contain the frame 212, leads 214, bumps 230 and chip 240. A melt molding compound material is then filled into the cavity of mold. After cooling and separating the molding compound material from the mold, the solid molding compound material 250 encapsulates the chip 240, frame 212 and leads 214 and exposes the lower surface of the leads 214 and backside surface 244 of the chip 240. The exposed lower surface of the leads 214 is used to electrically connect with other carriers or elements and to improve the heat-dissipating of the package.

Furthermore, after the molding step, a singulation step follows. For example, the molded leadframe with chips is divided into packages by trimming, whereby the quad flat non-lead flip chip package 200 in the present invention can be obtained as shown in FIG. 6.

Please refer to FIGS. 5 and 6. The sacrificial film 220 attached to the bump connection region 214a of the leads 214 has non-stick property against solder, just like the conventional solder mask layer. Further, the sacrificial film 220 does not require a photo-masking process for defining positions of the openings of the solder mask layer. Thus, the sacrificial film can replace the conventional solder mask layer which is harder and more costly to manufacture. Besides, the sacrificial film 220 with non-stick property against solder can be removed from the leads 214 after the reflow step. Thus, the molding compounding material 250 is able to directly contact with the upper surface of the leads 214 during the molding step. Therefore, the delamination between the molding compound material 250 and the leads 214 can be prevented.

Figure 7:
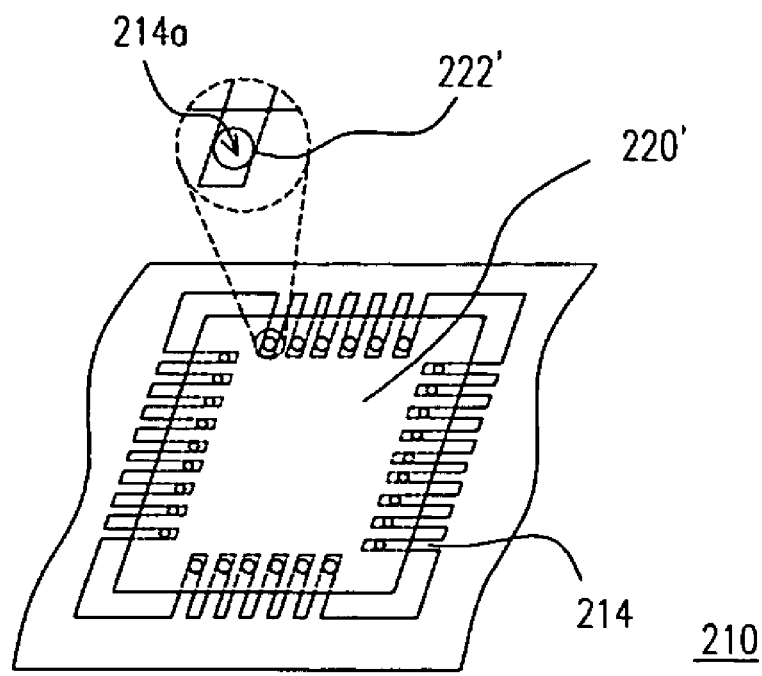
FIG. 7 is a schematic view showing a sacrificial film having non-stick property against solder according to one embodiment of the present invention.

FIG. 7 is a schematic view showing a sacrificial film having non-stick property against solder according to another embodiment of the present invention. With reference to FIG. 7, a sacrificial film 220' can be a patterned film with plurality of openings 222'. The number of the openings 222' is consistent with that of the leads 214. The openings 222' respectively expose the bump connection regions 214a of the leads 214. Thus, the extent of the bumps when formed is limited.

Figure 8:
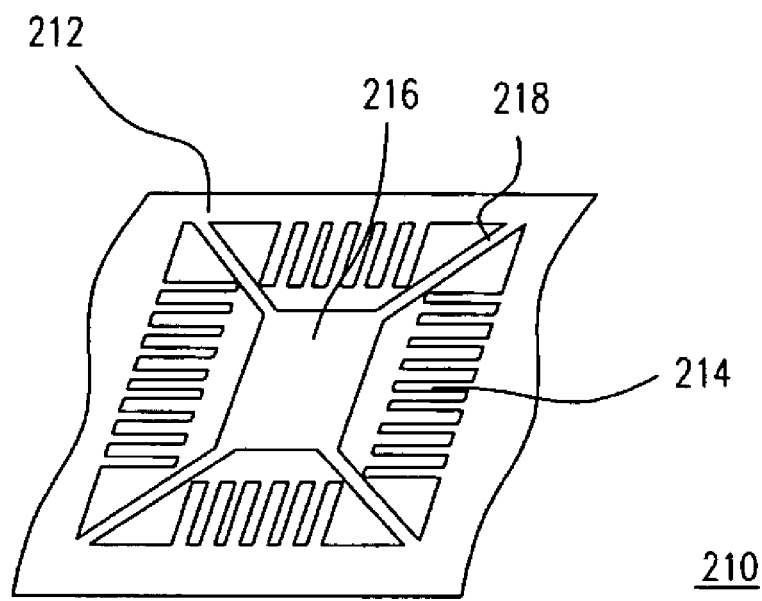
FIG. 8 is a schematic view showing a leadframe according to one embodiment of the present invention.

FIG. 8 is a schematic view showing a leadframe according to an embodiment of the present invention. With reference to FIG. 8, the leadframe 210 of the present invention further comprises a heat-dissipating plate 216 and at least a tie bar 218 for connecting the heat-dissipating plate to the frame 212. The leads 214 are disposed around the edges of the heat-dissipating plate 216. The heat generated by the chip is led out through the heat-dissipating plate 216 to enhance the heat dissipation of the package.

According to one embodiment of the present invention, the QFN package serves as an example. However, the present invention is not limited to QFN package. The present invention can also be applied to quad flat packages with I-type (QFI) and J-type (QFJ).

Accordingly, the present invention has at least the following merits:

1. In the quad flat flip chip packaging process and the leadframe therefor in the present invention, the sacrificial film with non-stick property against solder is formed on the leads of the leadframe to replace the conventional solder mask layer, and the process of photo-masking for defining positions of the openings of the solder mask layer can be spared. Therefore, the manufacturing cost can be reduced, and the manufacturing process can be simplified.
2. In the quad flat flip chip packaging process and the leadframe therefor in the present invention, the sacrificial film with non-stick property against solder can be removed from the leads after the reflow step, such that the delamination between the molding compound material and the leads can be prevented during the molding step.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A quad flat flip chip packaging process, comprising:
   providing a leadframe having at least a plurality of leads with an upper surface and a corresponding lower surface, wherein one end of each of the leads includes a bump connection region;
   forming a sacrificial film next to the bump connection region;
   providing a chip to electrically connect with the bump connection region of the leads through a plurality of bumps;
   removing the sacrificial film; and
   performing a molding step by using a molding compound material to encapsulate the chip and the leads and to expose the lower surface of the leads.

2. The quad flat flip chip packaging process of claim 1, wherein the sacrificial film has non-stick property against solder.

3. The quad flat flip chip packaging process of claim 1, wherein the sacrificial film is a patterned film with an opening for exposing the bump connection region of the leads.

4. The quad flat flip chip packaging process of claim 1, wherein the sacrificial film is a patterned film with a plurality of openings for respectively exposing the bump connection region of the leads.

5. The quad flat flip chip packaging process of claim 2, wherein the chip has a plurality of bonding pads disposed on the active surface of the chip, and the bonding pads of the chip are electrically connected with the bump connection region through the bumps by a reflow step.

6. The quad flat flip chip packaging process of claim 1, further comprising a singulation step after the molding step.

7. A leadframe for a quad flat flip chip package, comprising:
   a plurality of leads, wherein one end of each of the leads includes a bump connection region; and
   a detachable sacrificial film, disposed next to the bump connection region of the leads.

8. The leadframe of claim 7, wherein the sacrificial film has non-stick property against solder.

9. The leadframe of claim 7, wherein the sacrificial film is a patterned film with an opening for exposing the bump connection region of the leads.

10. The leadframe of claim 7, wherein the sacrificial film is a patterned film with a plurality of openings for respectively exposing the bump connection region of the leads.

11. The leadframe of claim 8, further comprising a frame, wherein the other end of each of the leads is connected with an inner edge of the frame.

12. The leadframe of claim 11, further comprising a heat-dissipating plate and at least a tie bar for connecting the heat-dissipating plate with the frame, wherein the leads are disposed around the heat-dissipating plate.

* * * * *